United States Patent
Sato

(10) Patent No.: US 7,064,453 B2
(45) Date of Patent: *Jun. 20, 2006

(54) SEMICONDUCTOR MEMORY DEVICE INCLUDING A GATE ELECTRODE WITH A RECESS

(75) Inventor: Tetsumasa Sato, Sakata (JP)

(73) Assignee: Seiko Epson Corporation (JP)

( * ) Notice: Subject to any disclaimer, the term of this patent is extended or adjusted under 35 U.S.C. 154(b) by 57 days.

This patent is subject to a terminal disclaimer.

(21) Appl. No.: 10/865,227

(22) Filed: Jun. 10, 2004

(65) Prior Publication Data

US 2005/0012161 A1    Jan. 20, 2005

(30) Foreign Application Priority Data

Jun. 11, 2003    (JP)    ............... 2003-166634

(51) Int. Cl.
  H01L 27/10    (2006.01)
  H01L 29/739   (2006.01)
  H01L 29/73    (2006.01)
  H01L 29/76    (2006.01)
  H01L 29/94    (2006.01)

(52) U.S. Cl. ............... 257/903; 257/202; 257/203; 257/204; 257/206; 257/401

(58) Field of Classification Search ........ 257/202–203, 257/206, 903, 204, 401
See application file for complete search history.

(56) References Cited

U.S. PATENT DOCUMENTS

| | | | | | |
|---|---|---|---|---|---|
| 3,824,564 | A | * | 7/1974 | Wegener | 365/184 |
| 4,055,836 | A | * | 10/1977 | Weimer | 365/183 |
| 4,151,607 | A | * | 4/1979 | Koyanagi et al. | 365/174 |
| 4,710,897 | A | * | 12/1987 | Masuoka et al. | 365/182 |
| 4,907,057 | A | * | 3/1990 | Ariizumi et al. | 257/538 |
| 5,208,782 | A | * | 5/1993 | Sakuta et al. | 365/230.03 |
| 6,037,638 | A | | 3/2000 | Abe et al. | 257/393 |
| 6,064,608 | A | * | 5/2000 | Ikeda | 365/200 |
| 6,445,017 | B1 | * | 9/2002 | Song | 257/204 |
| 6,538,338 | B1 | * | 3/2003 | Kumagai et al. | 257/213 |
| 6,933,578 | B1 | * | 8/2005 | Sato | 257/393 |
| 2002/0037609 | A1 | * | 3/2002 | Zhang et al. | 438/162 |
| 2003/0111679 | A1 | * | 6/2003 | Kuge | 257/295 |
| 2003/0119265 | A1 | * | 6/2003 | Kawazawa | 438/275 |
| 2005/0018471 | A1 | * | 1/2005 | Arimoto et al. | 365/149 |
| 2005/0253143 | A1 | * | 11/2005 | Takaura et al. | 257/67 |

FOREIGN PATENT DOCUMENTS

| | | |
|---|---|---|
| JP | 05-265421 | 10/1993 |
| JP | 10-247691 | 9/1998 |
| JP | 2003-085975 | 3/2003 |

* cited by examiner

*Primary Examiner*—Ida M. Soward
(74) *Attorney, Agent, or Firm*—Harness, Dickey & Pierce, P.L.C.

(57) ABSTRACT

A configuration is provided to reduce variations in the width of the gate of a read-out transistor without increasing the surface area of a memory cell. To do this, a recess is provided in an inner corner of a gate electrode that is bent into an L-shape. The recess is located so as to face a rectangular portion of an active region of the memory cell.

7 Claims, 5 Drawing Sheets

SEMICONDUCTOR MEMORY DEVICE INCLUDING A GATE ELECTRODE WITH A RECESS

RELATED APPLICATIONS

This application claims priority to Japanese Patent Application No. 2003-166634 filed Jun. 11, 2003 which is hereby expressly incorporated by reference herein in its entirety.

BACKGROUND

1. Field of the Invention

The present invention relates to a semiconductor memory device, and particularly, to one suitable for an application to a 1.5-port SRAM (Static Random Access Memory).

2. Description of Related Art

In conventional semiconductor memory devices, there is a method of configuring an SRAM by, for example, as disclosed in Japanese Unexamined Patent Application Publication No. H10-247691, using four n-channel transistors and two p-channel transistors, two of these n-channel transistors being used as driver transistors, the other two n-channel transistors as transfer gates and the two p-channel transistors as load transistors.

Here, a driver transistor and a load transistor constitute a CMOS inverter, in which the n-channel transistor and the p-channel transistor are connected in series, and a flip-flop is configured by cross-coupling a pair of CMOS inverters.

On the other hand, a 1.5-port SRAM is configured to read-out without depending on a word line signal by adding another p-channel transistor to these four n-channel transistors and two p-channel transistors and using this added p-channel transistor as a read-out transistor.

Here, with such a 1.5-port SRAM, to reduce the surface area of a memory cell, the gate electrode of one of the CMOS inverters including the driver transistor and the load transistor is bent in an L-shape, and used as the gate electrode of a read-out transistor.

However, the following problem arises: When bending the gate electrode of one CMOS inverter including the driver transistor and the load transistor into an L-shape, due to variations in the patterning of the gate electrode, the gate width will vary in a corner part of the gate electrode. Therefore, when the corner part of the gate electrode is located in the vicinity of the read-out transistor, the gate width of the read-out transistor will vary and the performance of the read-out transistor will be reduced.

In consideration of this problem, the present invention is intended to provide a semiconductor memory device that enables a reduction in the variance in gate width of the read-out transistor without increasing the surface area of a memory cell.

SUMMARY

To solve the above issue, a semiconductor memory device according to one aspect of the present invention includes:

a first driver transistor;

a second driver transistor, the drain thereof connected to the gate of the first driver transistor, and the gate thereof connected to the drain of the first driver transistor;

a first load transistor connected in series to the first driver transistor, the gate thereof formed by extending the gate of the first driver transistor;

a second load transistor connected in series to the second driver transistor, the gate thereof formed by extending the gate of the second driver transistor;

a first transfer gate, the source thereof connected to the drain of the first driver transistor, the drain thereof connected to a first bit line, and the gate thereof connected to a word line;

a second transfer gate, the source thereof connected to the drain of the second driver transistor, the drain thereof connected to a second bit line, and the gate thereof connected to the word line;

a read-out transistor connected in series to the second load transistor, the gate thereof formed by bending the gate of the second load transistor into an L-shape; and a recess provided in an inner corner of the gate of the second driver transistor, the second load transistor and the read-out transistor.

Thereby, even in the case where the gate used for the second driver transistor and the second load transistor is bent, and the gate is used as the gate of the read-out transistor, it becomes possible to keep the inner corner of the gate used for the second driver transistor and the second load transistor at a distance from the read-out transistor without changing the position of the gate used for the second driver transistor and the second load transistor.

Therefore even in the case where the gate width of the gate used for the second driver transistor and the second load transistor varies in the corner part, the part where the gate width varies does not interfere with the read-out transistor while this corner part can be positioned in the vicinity of the read-out transistor. Also, a reduction in the performance of the read-out transistor can be prevented without increasing the surface area of a memory cell.

A semiconductor memory device according to another aspect of the present invention includes:

a first active region and a second active region separated from each other by an isolation region;

a first gate electrode positioned so as to intersect the first active region at two places and used for a pair of transfer gates;

a second gate electrode positioned so as to cut across the first active region and the second active region and used for a first driver transistor and a first load transistor;

a third gate electrode which is bent and positioned so as to cut across the first active region as well as to cut across the second active region at two places, and used for a second driver transistor, a second load transistor, and a read-out transistor; and a recess provided in an inner corner of the third gate electrode.

Thereby, even in the case where the third gate electrode used for the second driver transistor and the second load transistor is bent, and the third gate electrode is used as the gate of the read-out transistor, it becomes possible to keep the inner corner of the third gate electrode at a distance from the read-out transistor without changing the location of the third gate electrode.

Therefore, even in the case where the gate width of the third gate electrode varies in the corner part, the part where the gate width varies does not interfere with the read-out transistor while the corner part of the third gate electrode can be located in the proximity of the read-out transistor. Also, a reduction in the performance of the read-out transistor can be prevented, without increasing the surface area of a memory cell.

A semiconductor memory device according to yet another aspect of the present invention includes:

a first active region having a U-shaped pattern;

a second active region having a T-shaped pattern;

an isolation region separating the first and the second active region from each other;

a first gate electrode positioned so as to intersect the U-shaped pattern at two places and used for a pair of transfer gates;

a second gate electrode positioned so as to cut across the U-shaped pattern and the T-shaped pattern and used for a first driver transistor and a first load transistor;

a third gate electrode which is bent and positioned so as to cut across the U-shaped pattern as well as to cut across the T-shaped pattern at two places, and used for a second driver transistor, a second load transistor, and a read-out transistor; and a recess provided in an inner corner of the third gate electrode.

By bending the third gate electrode used for the second driver transistor and the second load transistor into an L-shape, it becomes possible to use the third gate electrode as the gate of the read-out transistor while allowing the inner corner of the third gate electrode to be kept at a distance from the read-out transistor.

Therefore, even in the case where the gate width of the third gate electrode varies in the corner part, the part where the gate width varies does not interfere with the read-out transistor without changing the position of the third gate electrode. Also, a reduction in the performance of the read-out transistor can be prevented without increasing the surface area of a memory cell.

Further, in the semiconductor memory device according to yet another aspect of the present invention, the U-shaped pattern includes a first rectangular region, and second and third rectangular regions each orthogonally coupled to the first rectangular region at both ends of the first rectangular region, while the T-shaped pattern includes a fourth rectangular region, and a fifth rectangular region orthogonally coupled to a central part of the fourth rectangular region. Also, the first active region and the second active region are positioned so that the first rectangular region and the fourth rectangular region face each other, the first gate electrode is positioned so as to intersect the second and the third rectangular regions, the second gate electrode is positioned so as to cut across the first and the fourth rectangular regions, and the third gate electrode is positioned and bent into an L-shape so as to cut across the first, the fourth and the fifth rectangular regions. At the same time, the recess is formed so that the part extended for intersecting the fourth rectangular region is kept at a distance from the fifth rectangular region.

Thereby, it becomes possible to form the read-out transistor in the second active region, and to use the third gate electrode used for the second driver transistor and the second load transistor as the gate electrode for the read-out transistor, while keeping the inner corner of the third gate electrode at a distance from the read-out transistor. At the same time, a reduction in the performance of the read-out transistor can be prevented without increasing the surface area of a memory cell.

Further, in the semiconductor memory device according to yet another aspect of the present invention, the distance between the recess and the fourth rectangular region is set so as to avoid a variation in the properties of the second load transistor, while the depth of the recess is set in a range so as to meet a minimum design dimension of the width of the third gate electrode.

Thereby, it becomes possible to provide a recess in the inner corner of the third gate electrode without changing any design rules. Also, a reduction in the performance of the read-out transistor can be prevented without increasing the surface area of a memory cell.

Further, the semiconductor memory device according to yet another aspect of the present invention further includes:

a first gate contact provided in the second gate electrode and located between the first driver transistor and the first load transistor;

a second gate contact provided in the third gate electrode and located on the side of the read-out transistor;

a first active contact provided in the second rectangular region delimited by the first gate electrode;

a second active contact provided in the third rectangular region delimited by the first gate electrode;

a third active contact provided in the first rectangular region between the first gate electrode and the second gate electrode;

a fourth active contact provided in the first rectangular region between the first gate electrode and the third gate electrode;

a fifth active contact provided in the first rectangular region between the second gate electrode and the third gate electrode;

a sixth active contact provided in the fourth rectangular region delimited by the second gate electrode;

a seventh active contact provided in the fourth rectangular region delimited by the third gate electrode;

an eighth active contact provided in the fifth rectangular region delimited by the third gate electrode;

a ninth active contact provided in the fourth rectangular region between the second gate electrode and the third gate electrode;

a first wiring layer connecting the third active contact, the sixth active contact, and the second gate contact;

a second wiring layer connecting the fourth active contact, the seventh active contact, and the first gate contact;

a word line connected to the first gate electrode;

a first bit line connected to the first active contact; and a second bit line connected to the second active contact.

Thereby, even in the case of having a recess in the inner corner of the third gate electrode, it becomes possible to connect the active contacts and the gate contacts without changing any design rules. Also, the deterioration of the performance of the 1.5-port SRAM can be prevented without increasing the surface area of a memory cell.

DETAILED DESCRIPTION

The following is an explanation of the preferred embodiments of a semiconductor memory device according to the present invention with reference to the drawings.

Figure 1:
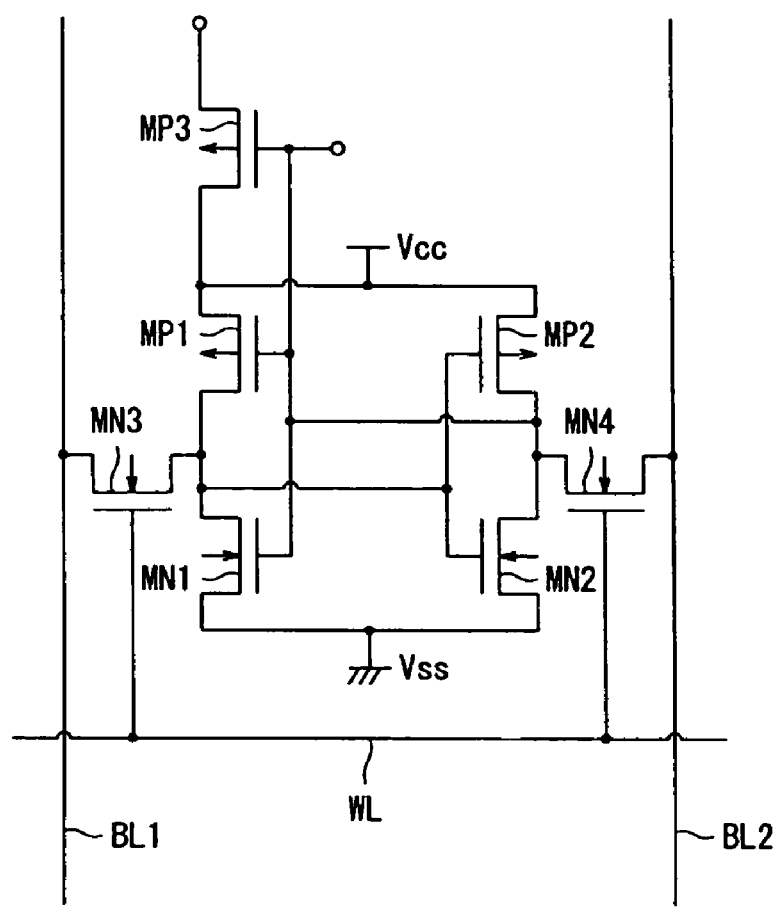
FIG. 1 is a circuit diagram showing a configuration of a semiconductor memory device according to a first embodiment.

FIG. 1 is a circuit diagram showing a configuration of a semiconductor memory device according to a first embodiment of the present invention.

In FIG. 1, an n-channel transistor MN1 and a p-channel transistor MP1 are connected in series, and also, an n-channel transistor MN2 and a p-channel transistor MP2 are connected in series. The gate of the n-channel transistor MN1 is connected to the gate of the p-channel transistor MP1 and the drain of the n-channel transistor MN2, while the gate of the n-channel transistor MN2 is connected to the gate of the p-channel transistor MP2 and the drain of the n-channel transistor MN1. Further, the sources of the n-channel transistors MN1 and MN2 are connected to a terminal $V_{SS}$, while the sources of the p-channel transistors MP1 and MP2 are connected to a terminal $V_{CC}$.

Further, the source of an n-channel transistor MN3 is connected to the drain of the n-channel transistor MN1, the drain of the n-channel transistor MN3 is connected to a bit line BL1, and the gate of the n-channel transistor MN3 is connected to a word line WL. Further, the source of an n-channel transistor MN4 is connected to the drain of the n-channel transistor MN2, the drain of the n-channel transistor MN4 is connected to a bit line BL2, and the gate of the n-channel transistor MN4 is connected to the word line WL.

Furthermore, a p-channel transistor MP3 is connected in series to the p-channel transistor MP1. The gate of the p-channel transistor MP3 is connected to the gate of the p-channel transistor MP1.

Here, with the n-channel transistors MN1 and MN2 serving as driver transistors, the n-channel transistors MN3 and MN4 serving as transfer gates, and the p-channel transistors MP1 and MP2 serving as load transistors, an SRAM is configured. Further, by using the p-channel transistor MP3 as a read-out transistor, a 1.5-port SRAM is configured.

Figure 2:
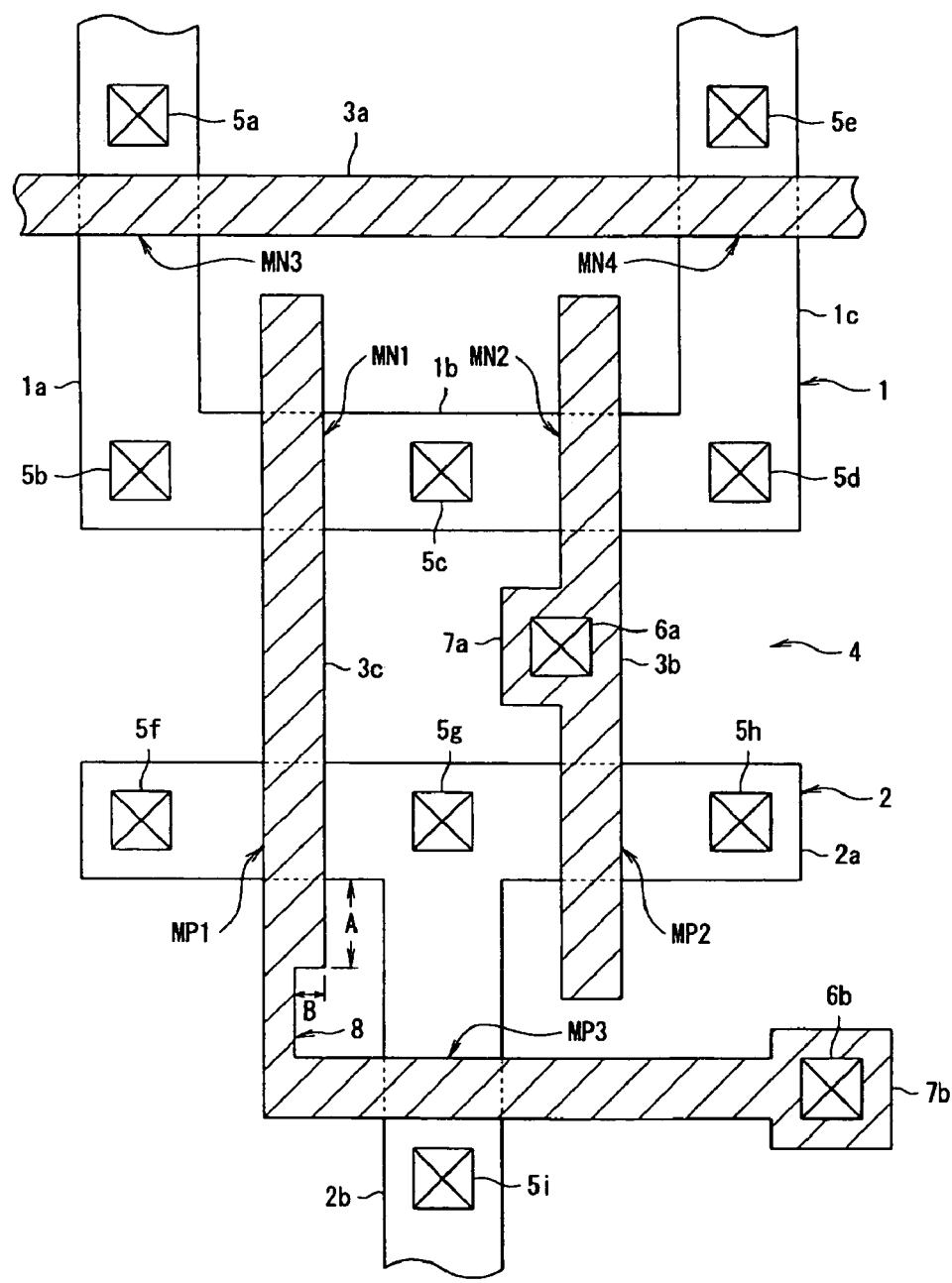
FIG. 2 is a plan view showing a layout of a semiconductor memory device according to a second embodiment.

FIG. 2 is a plan view showing a layout pattern of a gate electrode of a semiconductor memory device according to a second embodiment of the present invention.

In FIG. 2, a memory cell has active regions 1 and 2, separated from each other by an isolation region 4. The active regions 1 and 2 may include a channel region and a source/drain region to both sides of the channel region. The carrier concentration of the channel region is controlled by a voltage applied to gate electrodes 3a through 3c.

Here, the active region 1 has a U-shape pattern, and the U-shape pattern may include a rectangular region 1b, and rectangular regions 1a and 1c each orthogonally coupled to both ends of the rectangular region 1b. Further, the active region 2 has a T-shape pattern, and the T-shape pattern may include a rectangular region 2a, and a rectangular region 2b orthogonally coupled to a central part of the rectangular region 2a. The active regions 1 and 2 may be located so that the rectangular region 1b and the rectangular region 2a face each other.

The gate electrode 3a may be located so as to intersect the rectangular regions 1a and 1c. The gate electrode 3b may be located so as to cut across the rectangular regions 1b and 2a. The gate electrode 3c may be bent in an L-shape and located so as to cut across the rectangular regions 1b and 2a, and the rectangular region 2b as well.

Here, the gate electrode 3a located on the rectangular region 1a may be used for the n-channel transistor MN3 of FIG. 1, and the gate electrode 3a located on the rectangular region 1c may be used for the n-channel transistor MN4 of FIG. 1. The gate electrode 3b located on the rectangular region 1b may be used for the n-channel transistor MN2 of FIG. 1, and the gate electrode 3b located on the rectangular region 2a may be used for the p-channel transistor MP2 of FIG. 1. The gate electrode 3c located on the rectangular region 1b may be used for the n-channel transistor MN1 of FIG. 1, the gate electrode 3c located on the rectangular region 2a may be used for the p-channel transistor MP1 of FIG. 1, and the gate electrode 3c located on the rectangular region 2b may be used for the p-channel transistor MP3 of FIG. 1.

Further, the rectangular region 1a delimited by the gate electrode 3a has an active contact 5a, and the rectangular region 1c delimited by the gate electrode 3a has an active contact 5e. Further, the rectangular region 1a between the gate electrode 3a and the gate electrode 3c has an active contact 5b, the rectangular region 1a between the gate electrode 3b and the gate electrode 3c has an active contact 5c, and the rectangular region 1a between the gate electrode 3a and the gate electrode 3b has an active contact 5d.

Further, the rectangular region 2a delimited by the gate electrode 3b has an active contact 5h, the rectangular region 2a delimited by the gate electrode 3c has an active contact 5f, the rectangular region 2b delimited by the gate electrode 3c has an active contact 5i, and the rectangular region 2a between the gate electrode 3b and the gate electrode 3c has an active contact 5g.

Further, the gate electrode 3b has a gate contact region 7a for locating a gate contact 6a. Here, the gate contact region 7a may be located on the isolation region 4 between the n-channel transistor MN2 and the p-channel transistor MP2.

Further, the gate electrode 3c has a gate contact region 7b for locating a gate contact 6b. Here, the gate contact region 7b may be located on the isolation region 4 on the side of the p-channel transistor MP3.

By connecting the active contacts 5d, 5h and the gate contact 6b with an Al-wiring, and by connecting the active contacts 5b, 5f and the gate contact 6a with an Al-wiring, a pair of CMOS inverters composed of the r-channel transistors MN1, MN2 and the p-channel transistors MP1, MP2 is cross-coupled.

Further, the active contact 5a can be connected with an Al-wiring to the bit line BL1 of FIG. 1, the active contact 5b can be connected with an Al-wiring to the bit line BL2 of FIG. 1, the active contact 5c can be connected with an Al-wiring to the terminal $V_{SS}$ of FIG. 1, and the active contact 5g can be connected with an Al-wiring to the terminal $V_{CC}$ of FIG. 1.

The inner corner of the gate electrode 3c bent in an L-shape has a recess 8. This recess 8 may be located so as to face the rectangular region 2b. The gate electrodes 3a through 3c may be formed by patterning a polycrystalline silicon film and the like that has been deposited on the active regions 1 and 2.

By providing the recess 8 in the inner corner of the gate electrode 3c, in the case where the gate electrode 3c used for the n-channel transistor MN1 and the p-channel transistor MP1 is bent, and the gate electrode 3c is also used as the gate of the p-channel transistor MP3, it becomes possible to keep the inner corner of the gate electrode 3c at a distance from the p-channel transistor MP3 without altering the position of the gate electrode 3c.

Therefore, even in the case where the width of the gate varies in the corner part of the gate electrode 3c, the part where the gate width of the gate electrode 3c varies does not interfere with the p-channel transistor MP3 while allowing the corner part of the gate electrode 3c to be located in the vicinity of the p-channel transistor MP3. As a result, a reduction in the performance of the p-channel transistor MP3 can be prevented without increasing the surface area of a memory cell.

In the case of having the recess 8 in the inner corner of the gate electrode 3c, a distance A between the recess 8 and the rectangular region 2a can be chosen so as not to cause any variation in the properties of the p-channel transistor MP1, and the depth of the recess 8 can be chosen in a range so as not to make the gate width of the gate electrode 3c smaller than a minimum design dimension.

Thereby, without changing any design rules, it is possible to have the recess 8 in the inner corner of the gate electrode 3c, and without increasing the surface area of the memory cell, it is possible to avoid a reduction in the performance of the p-channel transistor MP3, and at the same time, to prevent a deviation in transistor properties between the p-channel transistors MP1 and MP2.

Figure 3:
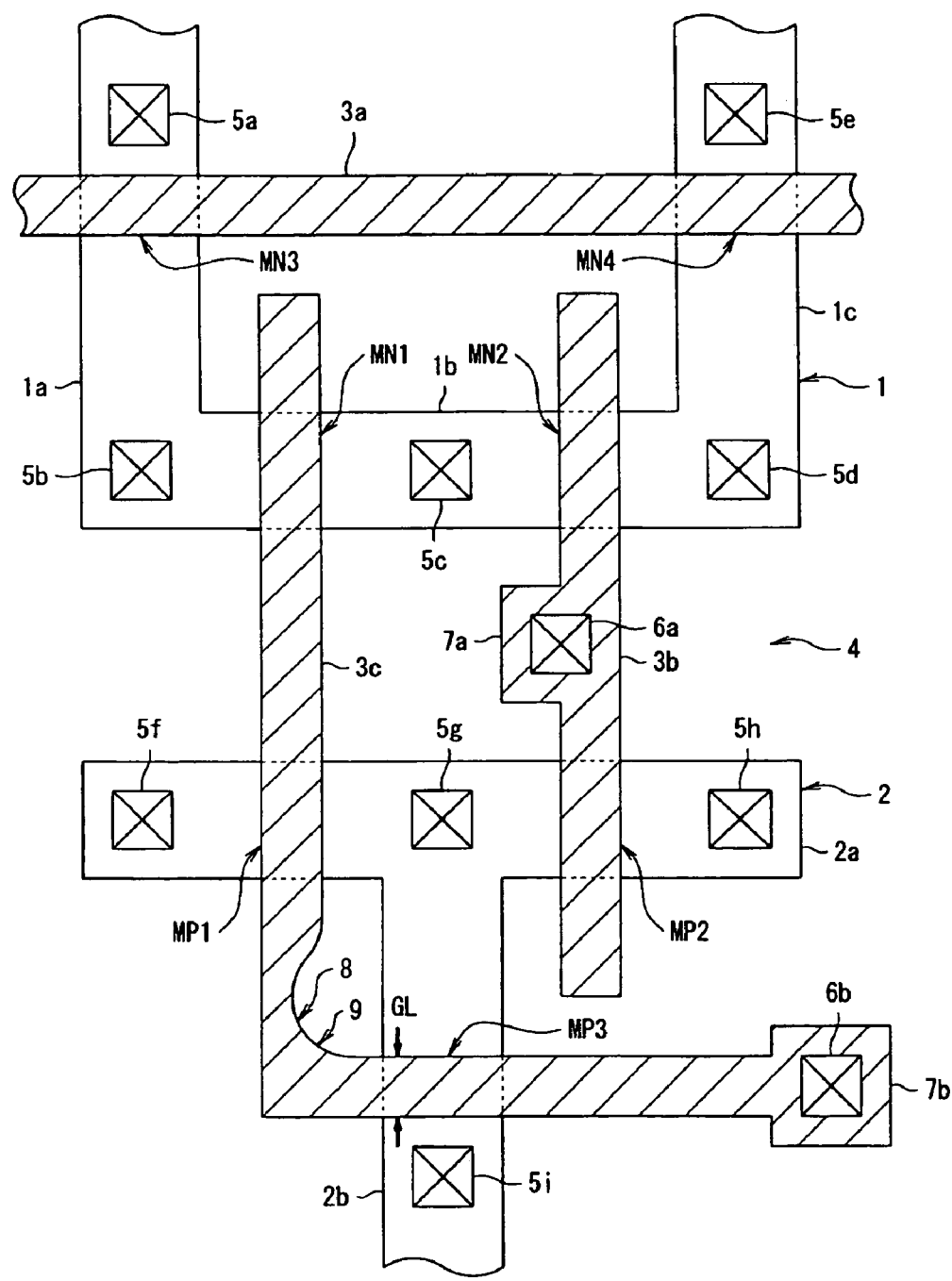
FIG. 3 is a plan view showing a configuration where variations have occurred at the patterning of the gate electrode.

FIG. 3 is a plan view showing a layout pattern when variations have occurred in the patterning of the gate electrode of a semiconductor memory device according to an embodiment of the present invention.

In FIG. 3, it is assumed that a skirt-like part 9 (arcuate) develops at the inner corner of the gate electrode 3c as a result of variations in the removing by etching of a polycrystalline silicon film deposited on the active regions 1 and 2. Here, as the inner corner of the gate electrode 3c has the recess 8, the skirt-like part 9 at the inner corner can be kept at a distance from the rectangular region 2b, and it can be avoided that the skirt-like part 9 at the inner corner interferes with the rectangular region 2b.

As a result, even in the case where the skirt-like part 9 develops at the inner corner of the gate electrode 3c, an increase in the gate width of the p-channel transistor MP3 can be avoided while allowing the corner part of the gate electrode 3c to be positioned in the vicinity of the p-channel transistor MP3. At the same time, a reduction in the performance of the p-channel transistor MP3 can be prevented without increasing the surface area of a memory cell.

Figure 4:
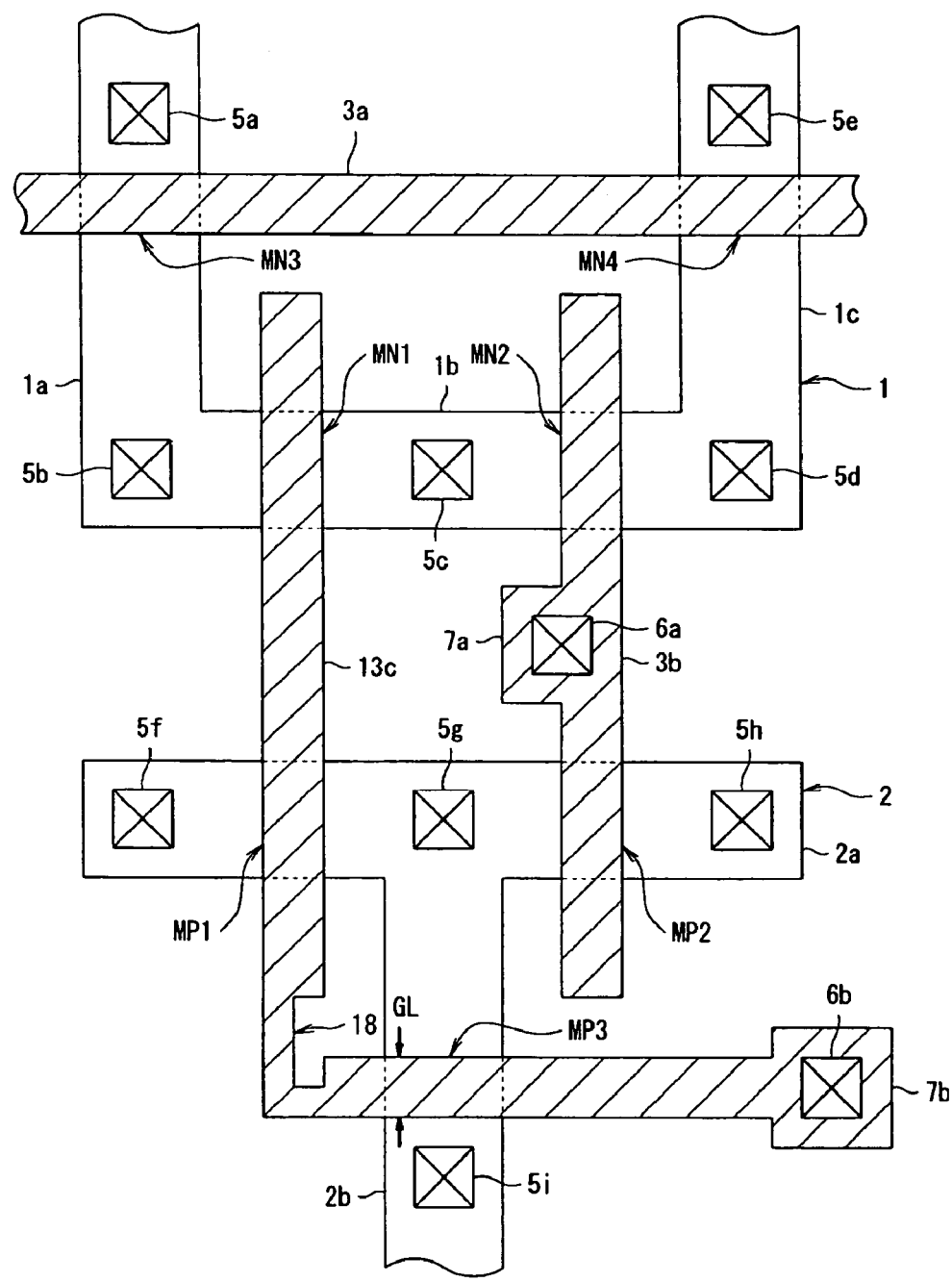
FIG. 4 is a plan view showing a layout of a semiconductor memory device according to a third embodiment.

FIG. 4 is a plan view showing a layout pattern of a gate electrode of a semiconductor memory device according to a third embodiment of the present invention.

In FIG. 4, a memory cell has a gate electrode 13c instead of the gate electrode 3c of FIG. 2. Here, the inner corner of the gate electrode 13c has a recess 18, and the recess 18 can be located so as to interfere with (reside within) both sides of the inner corner.

Thereby, even in the case where the gate electrode 13c used for the n-channel transistor MN1 and the p-channel transistor MP1 is bent, and the gate electrode 13c is used as the gate of the p-channel transistor MP3, the inner corner of the gate electrode 13c can be kept at a distance from the p-channel transistor MP3, and an increase in the gate width of the inner corner can be avoided without changing the position of the gate electrode 13c.

Therefore, even in the case where some left-over from the etching of the polycrystalline silicon film has remained at the inner corner of the gate electrode 13c, an increase in the gate width of the p-channel transistor MP13 can be avoided while making it possible to position the corner part of the gate electrode 13c in the vicinity of the p-channel transistor MP3. At the same time, a reduction in the performance of the p-channel transistor MP13 can be prevented without increasing the surface area of the memory cell.

Figure 5:
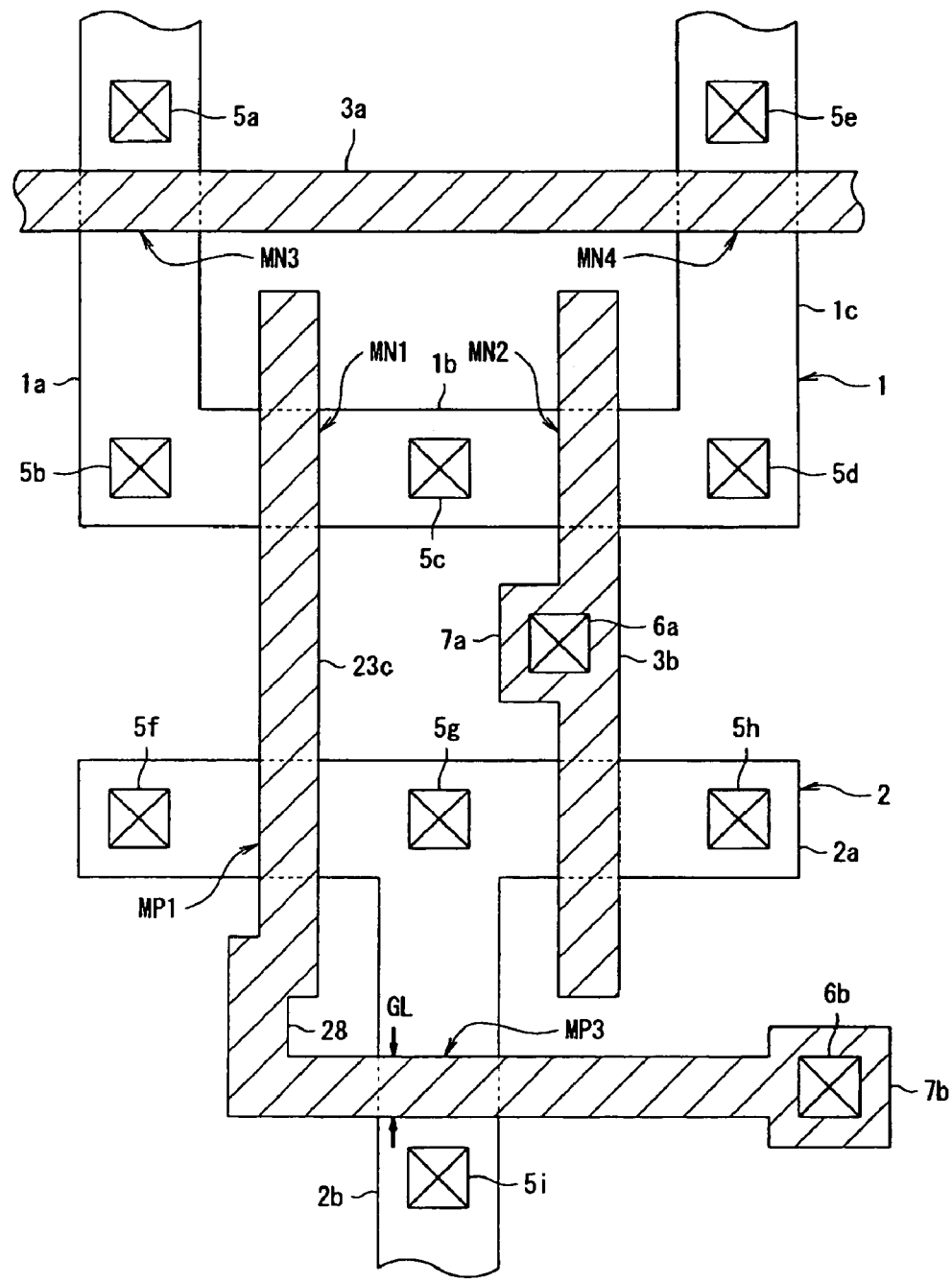
FIG. 5 is a plan view showing a layout of a semiconductor memory device according to a fourth embodiment.

FIG. 5 is a plan view showing a layout pattern of a gate electrode of a semiconductor memory device according to a fourth embodiment of the present invention.

In FIG. 5, a memory cell has a gate electrode 23c instead of the gate electrode 3c of FIG. 2, and the inner corner of the gate electrode 23c has a recess 28. Here, in the case of having the recess 28 at the inner corner of the gate electrode 23c, the gate electrode 23c can be made to first divert in a direction away from the p-channel transistor MP3, and then bend in a direction toward the p-channel transistor MP3 (the gate electrode 23c has a laterally offset portion).

Thereby, even in the case of bending the gate electrode 23c used for the n-channel transistor MN1 and the p-channel transistor MP1 and using the gate electrode 23c as the gate of the p-channel transistor MP3, the inner corner of the gate electrode 23c can be kept at a distance from the p-channel transistor MP3 without changing the position of the gate electrode 23c, and furthermore, a defined gate width of the gate electrode 23c can be maintained.

Therefore, even in the case where some left-over material from the etching of the polycrystalline silicon film has remained at the inner corner of the gate electrode 23c, an increase in the gate width of the p-channel transistor MP23 can be avoided while making it possible to position the corner part of the gate electrode 23c in the vicinity of the p-channel transistor MP3. Furthermore, a reduction in the performance of the p-channel transistor MP3 is prevented while enabling a reduction in the surface area of the memory cell by making the gate width of the gate electrode 23c coincide with a minimum design dimension.

What is claimed is:

1. A semiconductor memory device, comprising:
    a first driver transistor having a gate and a drain;
    a second driver transistor including:
        a drain connected to the gate of the first driver transistor; and
        a gate connected to the drain of the first driver transistor;
    a first load transistor connected in series to the first driver transistor, the gate of the first load transistor being an extension of the gate of the first driver transistor;
    a second load transistor connected in series to the second driver transistor, the gate of the second load transistor being an extension of the gate of the second driver transistor;
    a first transfer gate including:
        a source connected to the drain of the first driver transistor,
        a drain connected to a first bit line; and
        a gate connected to a word line;
    a second transfer gate including:
        a source connected to the drain of the second driver transistor;
        a drain connected to a second bit line; and
        a gate connected to the word line;
    a read-out transistor connected in series to the second load transistor, the gate of the read-out transistor being a bended extension of the gate of the second load transistor, the gate of the second load transistor being L-shaped; and
    a recess provided in an inner corner of the gate of the second driver transistor, the second load transistor and the read-out transistor.

2. A semiconductor memory device, comprising:
    a first active region and a second active region separated from each other by an isolation region;

a first gate electrode positioned so as to intersect the first active region at two places and used for a pair of transfer gates;

a second gate electrode positioned so as to cut across the first active region and the second active region and used for a first driver transistor and a first load transistor;

a third gate electrode bent and positioned so as to cut across the first active region as well as to cut across the second active region at two places, and used for a second driver transistor, a second load transistor, and a read-out transistor; and a recess provided in an inner corner of the third gate electrode.

3. A semiconductor memory device, comprising:

a first active region having a U-shaped pattern;

a second active region having a T-shaped pattern;

an isolation region separating the first and the second active region from each other;

a first gate electrode positioned so as to intersect the U-shaped pattern at two places and used for a pair of transfer gates;

a second gate electrode positioned so as to cut across the U-shaped pattern and the T-shaped pattern and used for a first driver transistor and a first load transistor;

a third gate electrode bent and positioned so as to cut across the U-shaped pattern as well as to cut across the T-shaped pattern at two places, and used for a second driver transistor, a second load transistor, and a read-out transistor; and a recess provided in an inner corner of the third gate electrode.

4. The semiconductor memory device according to claim 3, wherein:

the U-shaped pattern includes first, second, and third rectangular regions, the second and third rectangular regions being orthogonally coupled to both ends of the first rectangular region;

the T-shape pattern includes a fourth rectangular region and a fifth rectangular region orthogonally coupled to a central part of the fourth rectangular region;

the first active region and the second active region are positioned so that the first rectangular region and the fourth rectangular region face each other;

the first gate electrode is positioned so as to intersect the second and the third rectangular regions;

the second gate electrode is positioned so as to cut across the first and the fourth rectangular regions;

the third gate electrode is positioned and bent into an L-shape so as to cut across the first, fourth and fifth rectangular regions; and the recess is formed so that the part extended for intersecting the fourth rectangular region is kept at a preselected distance from the fifth rectangular region.

5. The semiconductor memory device according to claim 4, wherein the distance between the recess and the fourth rectangular region is set to avoid a variation in properties of the second load transistor, and a depth of the recess is set in a range so as to meet a minimum design dimension of the width of the third gate electrode.

6. The semiconductor memory device according to claim 4, further comprising:

a first gate contact provided in the second gate electrode and located between the first driver transistor and the first load transistor;

a second gate contact provided in the third gate electrode and located on the side of the read-out transistor;

a first active contact provided in the second rectangular region delimited by the first gate electrode;

a second active contact provided in the third rectangular region delimited by the first gate electrode;

a third active contact provided in the first rectangular region between the first gate electrode and the second gate electrode;

a fourth active contact provided in the first rectangular region between the first gate electrode and the third gate electrode;

a fifth active contact provided in the first rectangular region between the second gate electrode and the third gate electrode;

a sixth active contact provided in the fourth rectangular region delimited by the second gate electrode;

a seventh active contact provided in the fourth rectangular region delimited by the third gate electrode;

an eighth active contact provided in the fifth rectangular region delimited by the third gate electrode;

a ninth active contact provided in the fourth rectangular region between the second gate electrode and the third gate electrode;

a first wiring layer connecting the third active contact, the sixth active contact, and the second gate contact;

a second wiring layer connecting the fourth active contact, the seventh active contact, and the first gate contact;

a word line connected to the first gate electrode;

a first bit line connected to the first active contact; and a second bit line connected to the second active contact.

7. The semiconductor memory device according to claim 5, further comprising:

a first gate contact provided in the second gate electrode and located between the first driver transistor and the first load transistor;

a second gate contact provided in the third gate electrode and located on the side of the read-out transistor;

a first active contact provided in the second rectangular region delimited by the first gate electrode;

a second active contact provided in the third rectangular region delimited by the first gate electrode;

a third active contact provided in the first rectangular region between the first gate electrode and the second gate electrode;

a fourth active contact provided in the first rectangular region between the first gate electrode and the third gate electrode;

a fifth active contact provided in the first rectangular region between the second gate electrode and the third gate electrode;

a sixth active contact provided in the fourth rectangular region delimited by the second gate electrode;

a seventh active contact provided in the fourth rectangular region delimited by the third gate electrode;

an eighth active contact provided in the fifth rectangular region delimited by the third gate electrode;

a ninth active contact provided in the fourth rectangular region between the second gate electrode and the third gate electrode;

a first wiring layer connecting the third active contact, the sixth active contact, and the second gate contact;

a second wiring layer connecting the fourth active contact, the seventh active contact, and the first gate contact;

a word line connected to the first gate electrode;

a first bit line connected to the first active contact; and a second bit line connected to the second active contact.

* * * * *